United States Patent
Lai et al.

(10) Patent No.: US 11,462,903 B2
(45) Date of Patent: Oct. 4, 2022

(54) ELECTROSTATIC DISCHARGE (ESD) CIRCUIT CAPABLE OF PROTECTING INTERNAL CIRCUIT FROM BEING AFFECTED BY ESD ZAPPING

(71) Applicant: eMemory Technology Inc., Hsin-Chu (TW)

(72) Inventors: Chih-Wei Lai, Zhubei (TW); Yun-Jen Ting, Zhubei (TW); Yi-Han Wu, Zhubei (TW); Kun-Hsin Lin, Zhubei (TW); Hsin-Kun Hsu, Zhubei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 368 days.

(21) Appl. No.: 16/897,484

(22) Filed: Jun. 10, 2020

(65) Prior Publication Data
US 2020/0395752 A1 Dec. 17, 2020

Related U.S. Application Data

(60) Provisional application No. 62/861,329, filed on Jun. 14, 2019.

(51) Int. Cl.
*H02H 9/04* (2006.01)
*H01L 27/02* (2006.01)
(Continued)

(52) U.S. Cl.
CPC ............... *H02H 9/046* (2013.01); *G11C 7/06* (2013.01); *G11C 16/0441* (2013.01);
(Continued)

(58) Field of Classification Search
CPC .................. H01L 27/0255–0277; H02H 9/046
See application file for complete search history.

(56) References Cited

U.S. PATENT DOCUMENTS

| 9,935,096 B2 * | 4/2018 | Ikeda ................... H01L 27/0635 |
| 2003/0076639 A1 * | 4/2003 | Chen ................... H01L 27/0266 361/111 |

(Continued)

FOREIGN PATENT DOCUMENTS

| CN | 104319275 A | * | 1/2015 | ......... H01L 27/0285 |
| CN | 107946297 A | * | 4/2018 | ......... H01L 27/0266 |

(Continued)

*Primary Examiner* — Sisay G Tiku
(74) *Attorney, Agent, or Firm* — WPAT, PC

(57) ABSTRACT

An ESD circuit includes a voltage division circuit, a RC control circuit and a voltage selection circuit. The voltage division circuit is connected between a first power pad and a first node, and generates a first voltage. The RC control circuit is connected between the first power pad and a second power pad, and generates a second voltage and a third voltage. The voltage selection circuit receives the first voltage and the second voltage, and outputs a fourth voltage. The first transistor and the second transistor are serially connected between the first power pad and the second power pad. A gate terminal of the first transistor receives the first voltage. A gate terminal of the second transistor receives the third voltage. The third transistor is connected with the first power pad and an internal circuit. A gate terminal of the third transistor receives the fourth voltage.

12 Claims, 8 Drawing Sheets

(51) Int. Cl.
*G11C 7/06* (2006.01)
*G11C 16/04* (2006.01)
*G11C 16/08* (2006.01)
*G11C 16/12* (2006.01)
*G11C 16/14* (2006.01)
*G11C 16/24* (2006.01)
*G11C 16/26* (2006.01)

(52) U.S. Cl.
CPC ............. *G11C 16/08* (2013.01); *G11C 16/12* (2013.01); *G11C 16/14* (2013.01); *G11C 16/24* (2013.01); *G11C 16/26* (2013.01); *H01L 27/0255* (2013.01); *H01L 27/0277* (2013.01)

(56) References Cited

U.S. PATENT DOCUMENTS

| | | | | |
|---|---|---|---|---|
| 2006/0092589 | A1* | 5/2006 | Bhattacharya | H01L 27/0266 361/91.1 |
| 2007/0132030 | A1* | 6/2007 | Chen | H01L 27/0285 257/355 |
| 2007/0247772 | A1* | 10/2007 | Keppens | H01L 27/0266 361/56 |
| 2008/0316660 | A1* | 12/2008 | Huang | H02H 9/046 361/56 |
| 2009/0057768 | A1* | 3/2009 | Chen | H01L 23/60 257/E29.345 |
| 2009/0168280 | A1* | 7/2009 | Huang | H02H 9/046 361/56 |
| 2013/0141825 | A1* | 6/2013 | Kitagawa | H02H 9/046 361/56 |
| 2015/0245546 | A1* | 8/2015 | Lin | H01G 17/00 361/56 |
| 2017/0324238 | A1* | 11/2017 | Lee | H01L 27/0288 |
| 2018/0097357 | A1* | 4/2018 | Di Sarro | H01L 27/0266 |
| 2018/0102642 | A1* | 4/2018 | Ting | H02H 9/046 |
| 2018/0316185 | A1* | 11/2018 | Lai | G11C 17/16 |
| 2019/0165572 | A1* | 5/2019 | Lai | H01L 29/42328 |
| 2019/0326749 | A1* | 10/2019 | Lai | H01L 27/0924 |
| 2019/0326750 | A1* | 10/2019 | Ting | H02H 9/046 |
| 2020/0365578 | A1* | 11/2020 | Ting | G11C 16/10 |
| 2022/0158446 | A1* | 5/2022 | Lai | H01L 27/0266 |

FOREIGN PATENT DOCUMENTS

| | | | | |
|---|---|---|---|---|
| CN | 108807365 | B * | 10/2020 | ............. G06F 21/73 |
| EP | 2937901 | A1 * | 10/2015 | ......... H01L 27/0285 |
| EP | 3561872 | A1 * | 10/2019 | ............. G11C 7/065 |
| JP | 2018064082 | A * | 4/2018 | ............. G06F 21/72 |

* cited by examiner ic discharge (ESD)
ELECTROSTATIC DISCHARGE (ESD) CIRCUIT CAPABLE OF PROTECTING INTERNAL CIRCUIT FROM BEING AFFECTED BY ESD ZAPPING This application claims the benefit of U.S. provisional application Ser. No. 62/861,329, filed Jun. 14, 2019, the subject matter of which is incorporated herein by reference.

FIELD OF THE INVENTION

The present invention relates to a circuit, and more particularly to an electrostatic discharge (ESD) circuit.

BACKGROUND OF THE INVENTION

For increasing the operating speed and integration level of integrated circuits, the sizes of the semiconductor components are gradually decreased. For example, as the size of a CMOS IC is gradually decreased, the gate oxide layer becomes thinner and thinner. Consequently, the breakage voltage of the gate oxide layer is decreased, and the breakage voltage at the PN junction of the semiconductor component is also decreased. For example, the operation voltage of the MOS transistor fabricated by a low voltage device manufacturing process is 1.8V, and this MOS transistor can withstand the voltage stress of 4.5V.

As known, during the manufacturing process of the integrated circuit (IC), an ESD zapping effect may lead to the damage of the integrated circuit. For avoiding the ESD zapping effect, the integrated circuit is usually equipped with an ESD circuit. The ESD circuit provides an ESD current path. Since the ESD current flows through the ESD current path, the internal circuit of the integrated circuit is not damaged by the ESD current.

FIG. 1A is a schematic circuit diagram illustrating a conventional ESD circuit with low voltage devices in a high voltage operation environment. The ESD circuit 100 is connected with a high voltage pad 110, a medium voltage pad 120 and a low voltage pad 130. An internal circuit 140 is connected with the high voltage pad 110 and the low voltage pad 130. The high voltage pad 110 receives a first supply voltage $V_{PP}$. The medium voltage pad 120 receives a second supply voltage $V_L$. The low voltage pad 130 receives a third supply voltage $V_G$. For example, the first supply voltage $V_{PP}$ is 6V, the second supply voltage $V_L$ is 1.8V, and the third supply voltage $V_G$ is 0V.

The ESD circuit 100 comprises transistors Mn1 and Mn2. The drain terminal of the transistor Mn1 is connected with the high voltage pad 110. The gate terminal of the transistor Mn1 is connected with the medium voltage pad 120. The source terminal of the transistor Mn1 is connected with the drain terminal of the transistor Mn2. The gate terminal of the transistor Mn2 is connected with the low voltage pad 130. Moreover, the ESD circuit 100 further comprises a parasitic bipolar junction transistor Bp. The collector of the parasitic bipolar junction transistor Bp is connected with the high voltage pad 110. The emitter of the parasitic bipolar junction transistor Bp is connected with the low voltage pad 130. The base of the parasitic bipolar junction transistor Bp is connected with is connected with the body terminal of the transistor Mn1 and the body terminal of the transistor Mn2.

When the internal circuit 140 is in the normal working state, the ESD circuit 100 is not enabled and the first supply voltage $V_{PP}$ and the third supply voltage $V_G$ are transmitted to the internal circuit 140. In the ESD circuit 100, the transistor Mn1 is turned on and the voltage difference between the gate terminal and the drain terminal of the transistor Mn1 is equal to ($V_{PP}$–$V_L$), i.e., 6V-1.8V=4.2V. That is, the transistor Mn1 can withstand the voltage of 4.2V. Moreover, since the gate terminal of the transistor Mn2 receives the third supply voltage $V_G$ (e.g., 0V), the transistor Mn2 is turned off.

FIG. 1B is a schematic circuit diagram illustrating the operations of the conventional ESD circuit when receiving the positive ESD zap. When the high voltage pad 110 receives the positive ESD zap, the parasitic bipolar junction transistor Bp of the ESD circuit 100 is turned on. Under this circumstance, the ESD current $I_{ESD}$ flows from the high voltage pad 110 to the low voltage pad 130 through the parasitic bipolar junction transistor Bp. Since the ESD current $I_{ESD}$ can be discharged by the ESD circuit 100, the internal circuit 140 can be protected by the ESD circuit 100.

Since the current gain β of the parasitic bipolar junction transistor Bp is very low, the discharging efficiency of the ESD circuit 100 is usually unsatisfied. Moreover, when the ESD circuit 100 receives the positive ESD zap, the parasitic bipolar junction transistor Bp is turned on after the voltage at the base of the parasitic bipolar junction transistor Bp exceeds a triggering voltage. That is, in a short transient period before the parasitic bipolar junction transistor Bp is turned on, the ESD current $I_{ESD}$ is possibly transferred to the internal circuit 140. Consequently, the internal circuit 140 is possibly damaged.

SUMMARY OF THE INVENTION

An embodiment of the present invention provides an electrostatic discharge (ESD) circuit. The ESD circuit is connected with an internal circuit. The ESD circuit includes a first voltage division circuit, a RC control circuit, a voltage selection circuit, a first transistor, a second transistor and a third transistor. The first voltage division circuit is connected between a first power pad and a first node. The first voltage division circuit generates a first voltage. The RC control circuit is connected between the first power pad and a second power pad. The RC control circuit generates a second voltage and a third voltage. The voltage selection circuit is connected with the first node and the RC control circuit. The voltage selection circuit receives the first voltage and the second voltage, and outputs a fourth voltage. If the first voltage is higher than the second voltage, the fourth voltage is equal to the first voltage. If the second voltage is higher than the first voltage, the fourth voltage is equal to second voltage. A first terminal of the first transistor is connected with the first power pad. A second terminal of the first transistor is connected with a second node. A gate terminal of the first transistor receives the first voltage. A first terminal of the second transistor is connected with the second node. A second terminal of the second transistor is connected with the second power pad. A gate terminal of the second transistor receives the third voltage. A first terminal of the third transistor is connected with the first power pad. A second terminal of the third transistor is connected with the internal circuit. A gate terminal of the third transistor receives the fourth voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
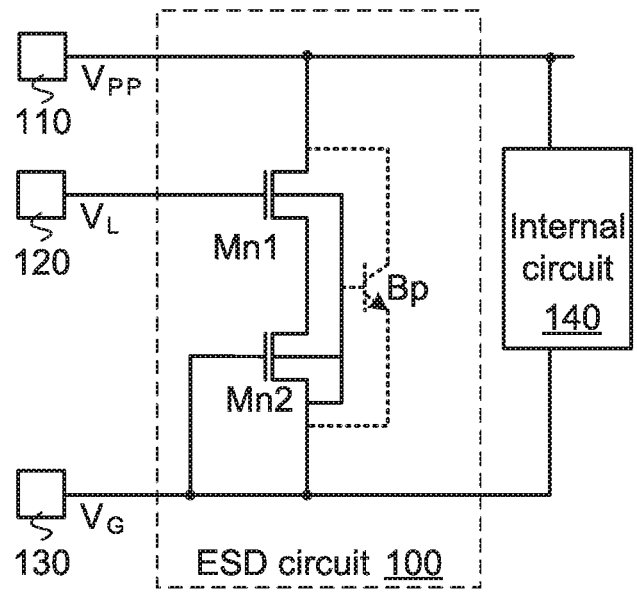
FIG. 1A (prior art) is a schematic circuit diagram illustrating a conventional ESD circuit with low voltage devices in a high voltage operation environment.
Figure 1B:
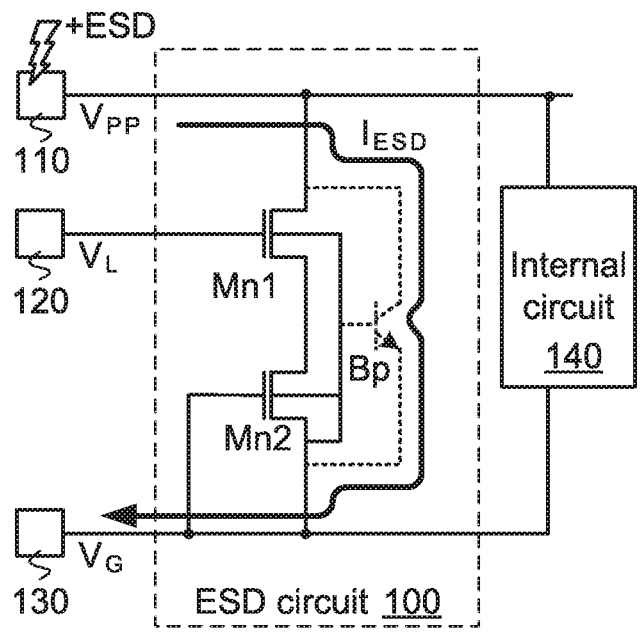
FIG. 1B (prior art) is a schematic circuit diagram illustrating the operations of the conventional ESD circuit when receiving the positive ESD zap.
Figure 2A:
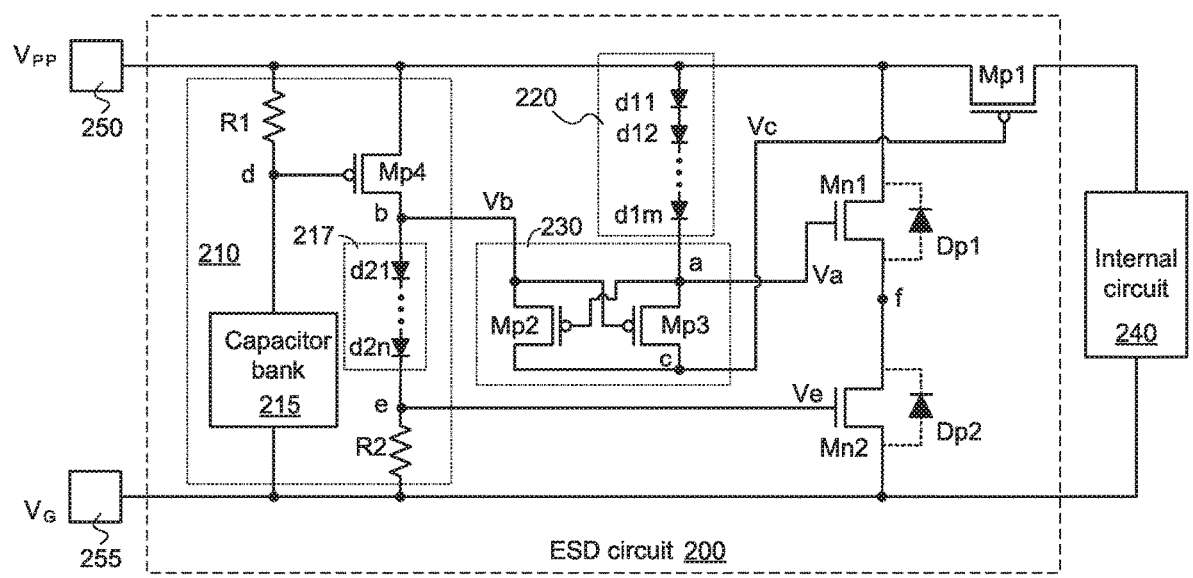
FIG. 2A is a schematic circuit diagram illustrating an ESD circuit according to an embodiment of the present invention.

FIG. 2A is a schematic circuit diagram illustrating an ESD circuit according to an embodiment of the present invention. The ESD circuit 200 is connected with a first power pad 250 and a second power pad 255. An internal circuit 240 is connected with the first power pad 250 and the second power pad 255. The first power pad 250 receives a first supply voltage $V_{PP}$. The second power pad 255 receives a second supply voltage $V_G$. The magnitude of the first supply voltage $V_{PP}$ is higher than the magnitude of the second supply voltage $V_G$. For example, the first supply voltage $V_{PP}$ is 5.25V, and the second supply voltage $V_G$ is 0V.

In an embodiment, the ESD circuit 200 comprises a RC control circuit 210, a voltage division circuit 220, a voltage selection circuit 230, a transistor Mn1, a transistor Mn2 and a transistor Mp1. The voltage division circuit 220 is a voltage drop circuit. The transistor Mn1 and the transistor Mn2 are N-type transistors. The transistor Mp1 is a P-type transistor.

A first terminal of the transistor Mp1 is connected with the first power pad 250. A second terminal of the transistor Mp1 is connected with a first terminal of the internal circuit 240. A gate terminal of the transistor Mp1 is connected with the node c. A second terminal of the internal circuit 240 is connected with the second power pad 255.

A first terminal of the transistor Mn1 is connected with the first power pad 250. A second terminal of the transistor Mn1 is connected with the node f. A gate terminal of the transistor Mn1 is connected with the node a. A first terminal of the transistor Mn2 is connected with the node f. A second terminal of the transistor Mn2 is connected with the second power pad 255. A gate terminal of the transistor Mn2 is connected with the node e.

The transistor Mn1 and the transistor Mn2 are constructed in separate P-well regions. Consequently, the transistor Mn1 has an internal parasitic diode Dp1, and the transistor Mn2 has an internal parasitic diode Dp2. That is, two internal parasitic diodes Dp1 and Dp2 form a parasitic device connected between the first power pad 250 and the second power pad 255. Moreover, the cathode of the parasitic diode Dp1 is connected with the first terminal of the transistor Mn1. The anode of the parasitic diode Dp1 is connected with the second terminal of the transistor Mn1. The cathode of the parasitic diode Dp2 is connected with the first terminal of the transistor Mn2. The anode of the parasitic diode Dp2 is connected with the second terminal of the transistor Mn2. In other words, the parasitic diode Dp1 and the parasitic diode Dp2 are serially connected between the first power pad 250 and the second power pad 255.

The voltage division circuit 220 comprises plural diodes d11~d1m, which are connected between the first power pad 250 and the node a. The anode of the first diode d11 is connected with the first power pad 250. The cathode of the last diode d1m is connected with the node a. The anode of any other diode between the first diode d11 and the last diode d1m is connected with the cathode of the previous diode, and the cathode of any other diode between the first diode d11 and the last diode d1m is connected with the anode of the next diode. It is noted that the number of diodes in the voltage division circuit 220 is not restricted. That is, the number of diodes in the voltage division circuit 220 may be varied according to the magnitude of the first supply voltage $V_{PP}$ and the magnitude of the second supply voltage $V_G$.

The RC control circuit 210 comprises a first resistor R1, a second resistor R2, a capacitor bank 215, a transistor Mp4 and a voltage division circuit 217. A first terminal of the first resistor R1 is connected with the first power pad 250. A second terminal of the first resistor R1 is connected with the node d. A first terminal of the capacitor bank 215 is connected with the node d. A second terminal of the capacitor bank 215 is connected with the second power pad 255. The transistor Mp4 is a P-type transistor. A first terminal of the transistor Mp4 is connected with the first power pad 250. A second terminal of the transistor Mp4 is connected with the node b. A gate terminal of the transistor Mp4 is connected with the node d. A first terminal of the second resistor R2 is connected with the node e. A second terminal of the second resistor R2 is connected with the second power pad 255. The voltage division circuit 217 comprises plural diodes d21~d2n, which are serially connected between the node b and the node e. The anode of the first diode d21 is connected with the node b. The cathode of the last diode d2n is connected with the node e. The anode of any other diode between the first diode d21 and the last diode d2n is connected with the cathode of the previous diode, and the cathode of any other diode between the first diode d21 and the last diode d2m is connected with the anode of the next diode. It is noted that the number of diodes in the voltage division circuit 217 is not restricted.

The voltage selection circuit 230 comprises a transistor Mp2 and a transistor Mp3. The transistor Mp2 and the transistor Mp3 are P-type transistors. A first terminal of the transistor Mp2 is connected with the node b. A second terminal of the transistor Mp2 is connected with the node c. The gate terminal of the transistor Mp2 is connected with the node a. A first terminal of the transistor Mp3 is connected with the node a. A second terminal of the transistor Mp3 is connected with the node c. The gate terminal of the transistor Mp3 is connected with the node b.

In an embodiment, the voltage at the node a and the voltage at the node b with the higher voltage value is selected to be transmitted to the node c by the voltage selection circuit 230. For example, if the voltage Va at the node a is higher than the voltage Vb at the node b, the transistor Mp2 is turned off and the transistor Mp3 is turned on. Consequently, the voltage Vc at the node c is equal to the voltage Va at the node a. Whereas, if the voltage Vb at the node b is higher than the voltage Va at the node a, the transistor Mp2 is turned on and the transistor Mp3 is turned off. Consequently, the voltage Vc at the node c is equal to the voltage Vb at the node b.

Figure 2B:
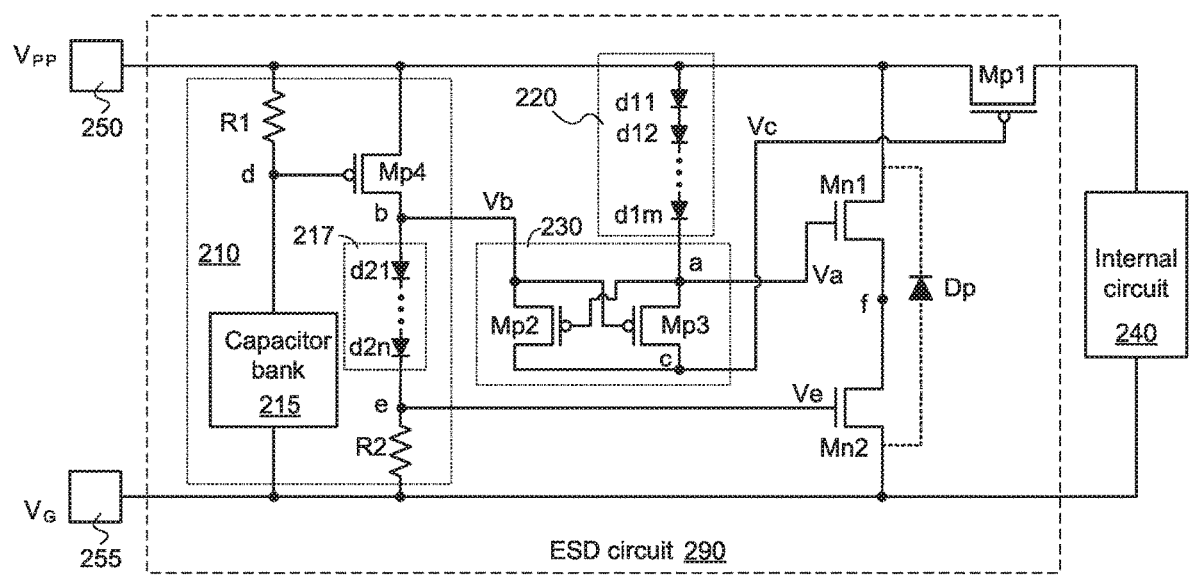
FIG. 2B is a schematic circuit diagram illustrating an ESD circuit according to another embodiment of the present invention.

FIG. 2B is a schematic circuit diagram illustrating an ESD circuit according to another embodiment of the present invention. In this embodiment, the transistor Mn1 and the transistor Mn2 of the ESD circuit 290 are constructed in a single P-well region. Consequently, only one internal parasitic diode Dp forms the parasitic device connected between the first power pad 250 and the second power pad 255.

FIGS. 3A to 3D schematically illustrate some examples of the capacitor bank used in the RC control circuit of the ESD circuit according to the embodiment of the present invention.

Figure 3A:
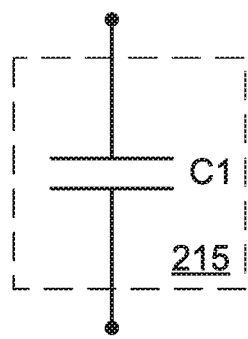
FIGS. 3A to 3D schematically illustrate some examples of the capacitor bank used in the RC control circuit of the ESD circuit according to the embodiment of the present invention.

In the example of FIG. 3A, the capacitor bank 215 comprises a single capacitor C1. The capacitor C1 is connected between the node d of the RC control circuit 221 and the second power pad 255.

Figure 3B:
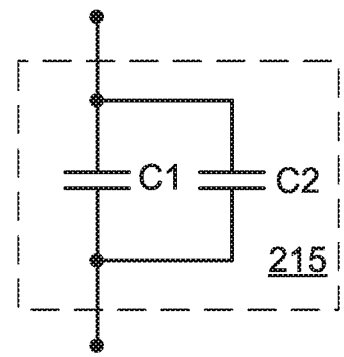

In the example of FIG. 3B, the capacitor bank 215 comprises two capacitors C1 and C2. The two capacitors C1 and C2 are connected with each other in parallel. Moreover, the two capacitors C1 and C2 are connected between the node d of the RC control circuit 221 and the second power pad 255.

Figure 3C:
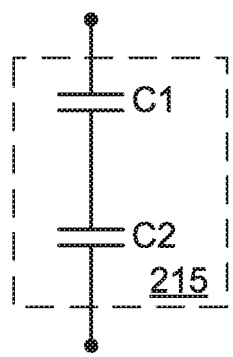

In the example of FIG. 3C, the capacitor bank 215 comprises two capacitors C1 and C2. The two capacitors C1 and C2 are connected with each other in series. Moreover, the two capacitors C1 and C2 are connected between the node d of the RC control circuit 221 and the second power pad 255.

Figure 3D:
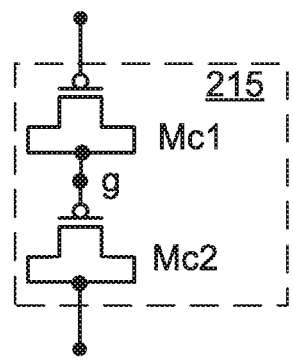

In another embodiment, the functions of the capacitors C1 and C2 are implemented through transistors. In the example of FIG. 3D, the capacitor bank 215 comprises two transistors Mc1 and Mc2. A gate terminal of the transistor Mc1 is the first terminal of the capacitor bank 215. A first terminal and a second terminal of the transistor Mc1 are connected with the node g. The gate of the transistor Mc2 is connected with the node g. A first terminal and a second terminal of the transistor Mc2 are connected with the second terminal of the capacitor bank 215.

The operations of the ESD circuit 200 will be described as follows. The ESD circuit 290 has the similar operations with the ESD circuit 200 and is not redundantly described herein.

The first supply voltage $V_{PP}$ is 5.25V, and the second supply voltage $V_G$ is 0V. The capacitor bank 215 comprises two capacitors C1 and C2, which are connected with each other in series. The voltage division circuit 220 comprises five diodes d11~d15. The voltage division circuit 217 comprises three diodes d21~d23. It is noted that the magnitude of the first supply voltage $V_{PP}$, the magnitude of the second supply voltage $V_G$, the circuitry of the capacitor bank 215, the number of diodes in the voltage division circuit 217 and the number of diodes in the voltage division circuit 220 may be varied according to the practical requirements.

Figure 4A:
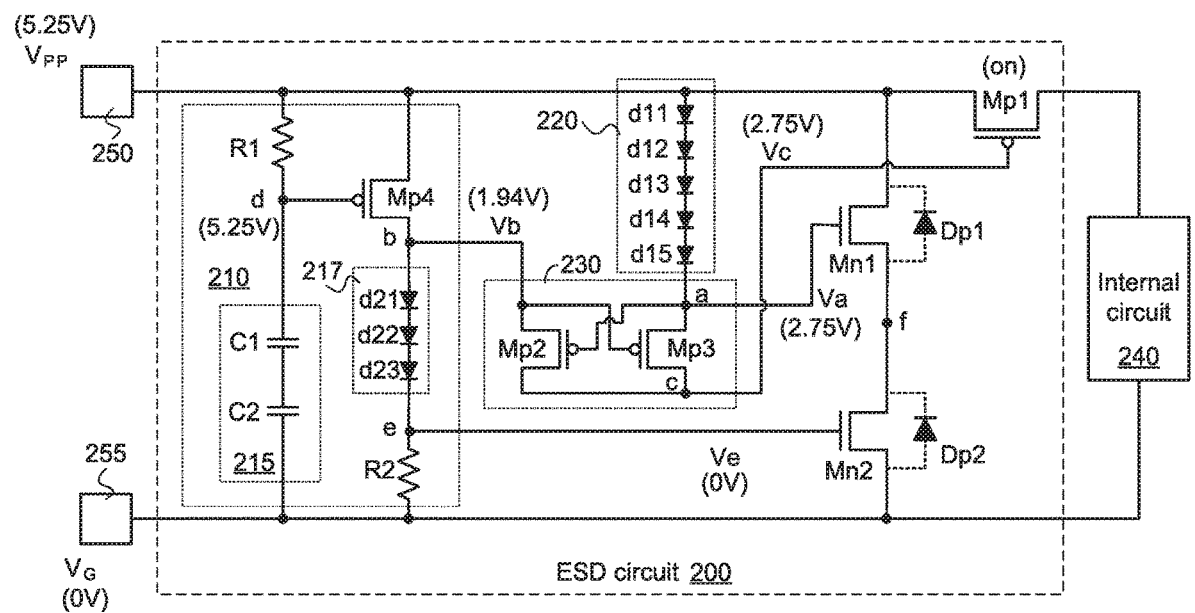
FIG. 4A is a schematic circuit diagram illustrating the operations of the ESD circuit of the present invention when no ESD zap is received.
Figure 4B:
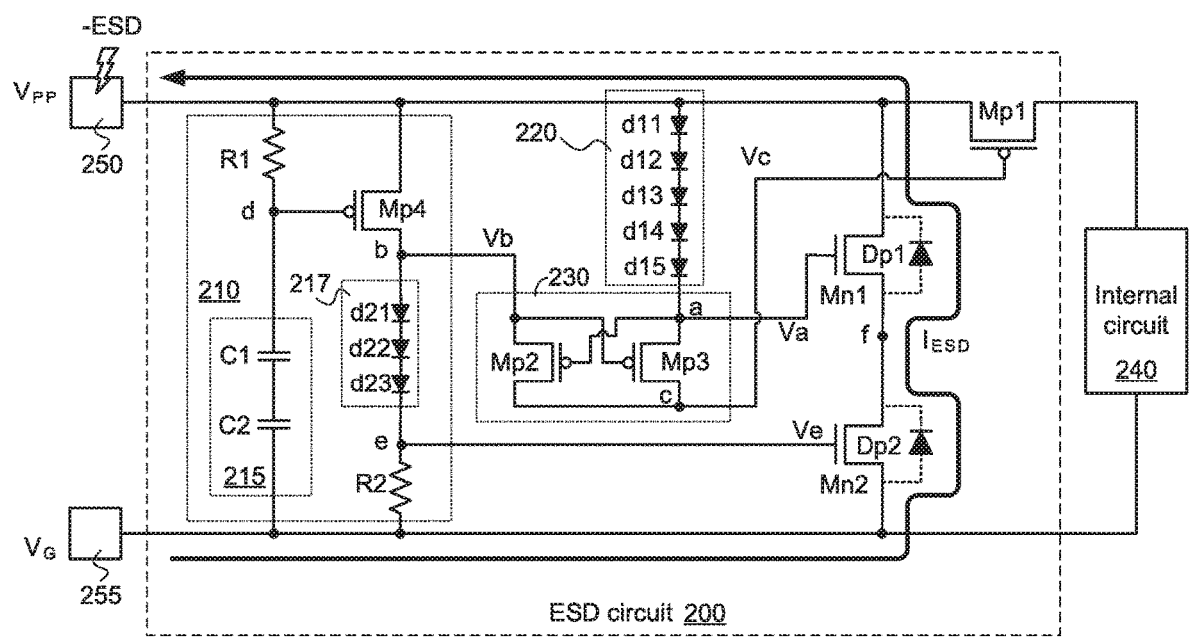
FIG. 4B is a schematic circuit diagram illustrating the operations of the ESD circuit of the present invention when the negative ESD zap is received.
Figure 4C:
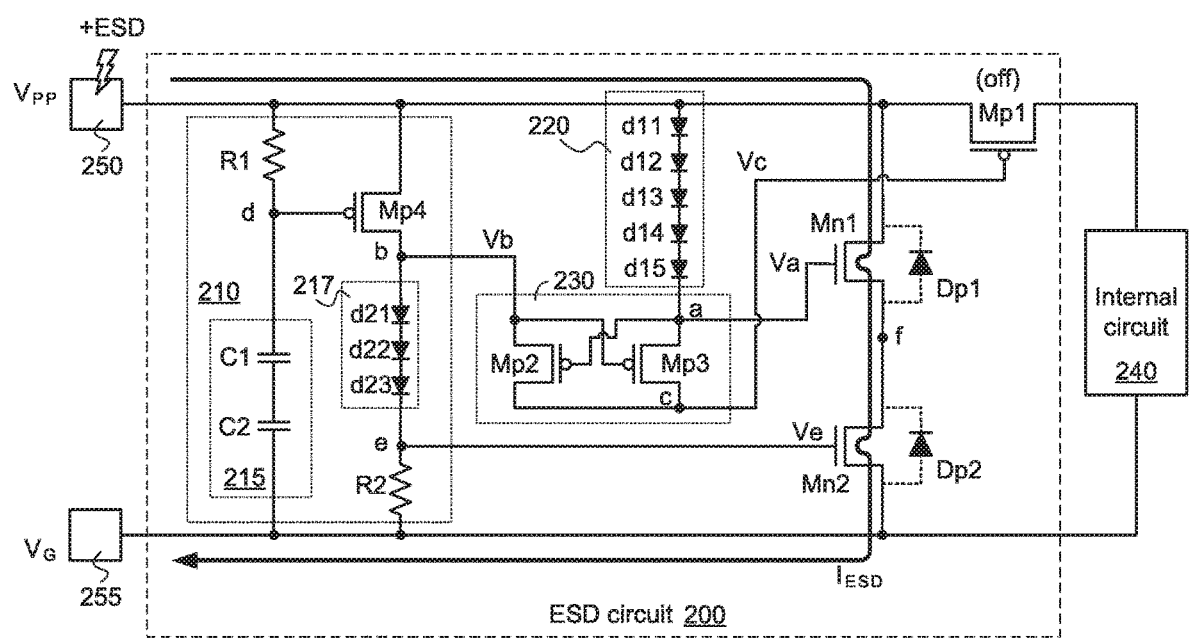
FIG. 4C is a schematic circuit diagram illustrating the operations of the ESD circuit of the present invention when the positive ESD zap is received.

FIG. 4A is a schematic circuit diagram illustrating the operations of the ESD circuit of the present invention when no ESD zap is received. FIG. 4B is a schematic circuit diagram illustrating the operations of the ESD circuit of the present invention when the negative ESD zap is received. FIG. 4C is a schematic circuit diagram illustrating the operations of the ESD circuit of the present invention when the positive ESD zap is received.

Please refer to FIG. 4A. Since the ESD circuit 200 does not receive the ESD zap, the internal circuit 240 can be operated normally.

The voltage at the node d of the RC control circuit 210 is 5.25V. Consequently, the transistor Mp4 is turned off, and the node b is in a floating state. Meanwhile, the voltage Ve at the node e is 0V, and the voltage Vb at the node b is about 1.94V. Since the voltage division circuit 220 comprises five serially-connected diodes d11~d15, the voltage Va at the node a is about 2.75V.

Since the voltage Ve at the node e is 0V, the transistor Mn2 is turned off completely. In other words, no leakage current is transferred from the first power pad 250 to the second power pad 255 through the transistors Mn1 and Mn2.

Moreover, since the voltage Va at the node a is higher than the voltage Vb at the node b, the voltage Va at the node a is transmitted to the node c by the voltage selection circuit 230. That is, the voltage Vc at the node c is equal to the voltage Va at the node a. Since the voltage Vc at the node c is 2.75V, the transistor Mp1 is turned on. The first supply voltage $V_{PP}$ received by the first power pad 250 is transmitted to the internal circuit 240 through the transistor Mp1. Consequently, the internal circuit 240 can be operated normally Please refer to FIG. 4B. When the first power pad 250 receives the negative ESD zap (−ESD), the parasitic diode Dp1 I of the transistor Mn1 and the parasitic diode Dp2 of the transistor Mn2 are forwardly biased. That is, the parasitic device is turned on. Consequently, the ESD current $I_{ESD}$ is transferred to from the second power pad 255 to the first power pad 250 through the parasitic diode Dp2 and the parasitic diode Dp1 of the parasitic device. In other words, the ESD current $I_{ESD}$ cannot be transferred to the internal circuit 240 when the first power pad 250 receives the negative ESD zap (−ESD). Consequently, the internal circuit 240 can be protected by the ESD circuit 200.

Please refer to FIG. 4C. When the first power pad 250 receives the positive ESD zap (+ESD), the first supply voltage $V_{PP}$ rises at a fast speed. Consequently, the capacitors C1 and C2 of the capacitor bank 215 are in a short-circuited status temporarily. Meanwhile, the voltage at the node d is equal to $V_G$ (0V). The transistor Mp4 is turned on. The voltage Vb at the node b is equal to the first supply voltage $V_{PP}$. The voltage Ve at the node e is slightly lower than the first supply voltage $V_{PP}$. Moreover, due to the voltage division circuit 220, the voltage Va at the node a is slightly lower than the first supply voltage $V_{PP}$.

Since the voltage Va at the node a is slightly lower than the first supply voltage $V_{PP}$ and the voltage Ve at the node e is slightly lower than the first supply voltage $V_{PP}$, both of the transistor Mn1 and the transistor Mn2 are turned on. Consequently, the ESD current $I_{ESD}$ is transferred to from the first power pad 250 to the second power pad 255 through the transistor Mn1 and the transistor Mn2.

Moreover, since the voltage Vb at the node b is higher than the voltage Va at the node a, the voltage Va at the node b is transmitted to the node c by the voltage selection circuit 230. That is, the voltage Vc at the node c is equal to the voltage Vb at the node b and equal to the first supply voltage $V_{PP}$. Consequently, the transistor Mp1 is turned off. Since the transistor Mp1 is turned off, the ESD current $I_{ESD}$ cannot be transferred to the internal circuit 240. In other words, the ESD current $I_{ESD}$ cannot be transferred to the internal circuit 240 when the first power pad 250 receives the positive ESD zap (+ESD). Consequently, the internal circuit 240 can be protected by the ESD circuit 200.

Figure 5:
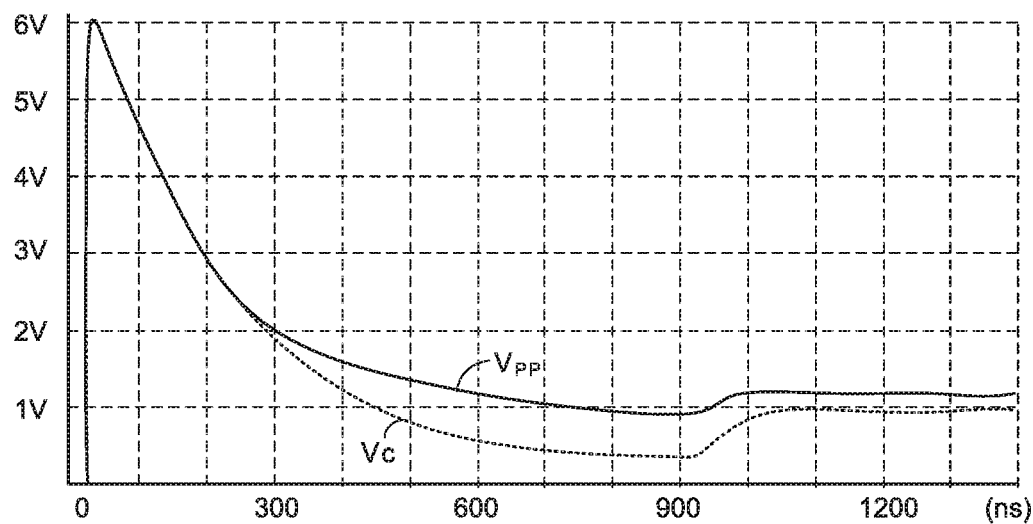
FIG. 5 is a plot illustrating the changes of the supply voltage $V_{PP}$ and the node voltage Vc of the ESD circuit with the increasing time when the HBM test is performed.

Take a human body mode (HBM) test for example. FIG. 5 is a plot illustrating the changes of the supply voltage $V_{PP}$ and the node voltage Vc of the ESD circuit with the increasing time when the HBM test is performed. When an electrostatic voltage of 2 KV is applied to the first power pad 250, the first supply voltage $V_{PP}$ is increased to about 6V and the ESD current $I_{ESD}$ is transferred to from the first power pad 250 to the second power pad 255 through the transistor Mn1 and the transistor Mn2. After about 300 ns, the first supply voltage $V_{PP}$ and the node voltage Vc are decreased to be lower than 2V. Consequently, the first supply voltage $V_{PP}$ of 2V will not influence the semiconductor device of the internal circuit 240.

From the above descriptions, the present invention provides the ESD circuit. When the power pad receives the ESD zap, the ESD circuit can discharge the ESD current quickly. Consequently, the internal circuit can be protected by the ESD circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge (ESD) circuit connected with an internal circuit, the ESD circuit comprising:
   a first voltage division circuit connected between a first power pad and a first node, wherein the first voltage division circuit generates a first voltage;
   a RC control circuit connected between the first power pad and a second power pad, wherein the RC control circuit generates a second voltage and a third voltage;
   a voltage selection circuit connected with the first node and the RC control circuit, wherein the voltage selection circuit receives the first voltage and the second voltage, and outputs a fourth voltage, wherein if the first voltage is higher than the second voltage, the fourth voltage is equal to the first voltage, wherein if the second voltage is higher than the first voltage, the fourth voltage is equal to second voltage;
   a first transistor, wherein a first terminal of the first transistor is connected with the first power pad, a second terminal of the first transistor is connected with a second node, and a gate terminal of the first transistor receives the first voltage;
   a second transistor, wherein a first terminal of the second transistor is connected with the second node, a second terminal of the second transistor is connected with the second power pad, and a gate terminal of the second transistor receives the third voltage; and
   a third transistor, wherein a first terminal of the third transistor is connected with the first power pad, a second terminal of the third transistor is connected with the internal circuit, and a gate terminal of the third transistor receives the fourth voltage.

2. The ESD circuit as claimed in claim 1, wherein when the first power pad receives a positive ESD zap, the first transistor is turned on in response to the first voltage, the second transistor is turned on in response to the third voltage, and the third transistor is turned off in response to the fourth voltage, wherein the fourth voltage is equal to the second voltage.

3. The ESD circuit as claimed in claim 2, wherein when the first power pad receives the positive ESD zap, an ESD current flows from the first power pad to the second power pad through the first transistor and the second transistor.

4. The ESD circuit as claimed in claim 1, further comprising a parasitic device connected between the first power pad and the second power pad.

5. The ESD circuit as claimed in claim 4, wherein the first transistor has a first parasitic diode, the second transistor has a second parasitic diode, and the first parasitic diode and the second parasitic diode form the parasitic device, wherein a cathode of the first parasitic diode is connected with the first power pad, an anode of the first parasitic diode is connected with the second node, a cathode of the second parasitic diode is connected with the second node, and an anode of the second parasitic diode is connected with the second power pad.

6. The ESD circuit as claimed in claim 4, wherein when the first power pad receives a negative ESD zap, an ESD current flows from the second power pad to the first power pad through the parasitic device.

7. The ESD circuit as claimed in claim 1, wherein the first voltage division circuit comprises plural diodes, which are serially connected between the first power pad and the first node, wherein the first node generates the first voltage.

8. The ESD circuit as claimed in claim 7, wherein an anode of a first diode of the plural diodes is connected with the first power pad, and a cathode of a last diode of the plural diodes is connected with the first node, wherein an anode of any other diode between the first diode and the last diode is connected with a cathode of a previous diode, and a cathode of any other diode between the first diode and the last diode is connected with an anode of a next diode.

9. The ESD circuit as claimed in claim 1, wherein the RC control circuit comprises:
   a first resistor, wherein a first terminal of the first resistor is connected with the first power pad, and a second terminal of the first resistor is connected with a third node;
   a capacitor bank, wherein a first terminal of the capacitor bank is connected with the third node, and a second terminal of the capacitor bank is connected with the second power pad;
   a fourth transistor, wherein a first terminal of the fourth transistor is connected with the first power pad, a second terminal of the fourth transistor is connected with a fourth node, and a gate terminal of the fourth transistor is connected with the third node, wherein the fourth node generates the second voltage;
   a second voltage division circuit connected between the fourth node and a fifth node, wherein the fifth node generates the third voltage; and
   a second resistor, wherein a first terminal of the second resistor is connected with the fifth node, and a second terminal of the second resistor is connected with the second power pad.

10. The ESD circuit as claimed in claim 9, wherein the second voltage division circuit comprises plural diodes, wherein are serially connected between the fourth node and the fifth node.

11. The ESD circuit as claimed in claim 10, wherein an anode of a first diode of the plural diodes is connected with the fourth node, and a cathode of a last diode of the plural diodes is connected with the fifth node, wherein an anode of any other diode between the first diode and the last diode is connected with a cathode of a previous diode, and a cathode of any other diode between the first diode and the last diode is connected with an anode of a next diode.

12. The ESD circuit as claimed in claim 1, wherein the voltage selection circuit comprises:
- a fifth transistor, wherein a first terminal of the fifth transistor receives the second voltage, a second terminal of the fifth transistor is connected with a sixth node, and a gate terminal of the fifth transistor is connected with the first node, wherein the sixth node generates the fourth voltage; and
- a sixth transistor, wherein a first terminal of the sixth transistor is connected with the first node, a second terminal of the sixth transistor is connected with the sixth node, and a gate terminal of the sixth transistor receives the second voltage.

* * * * *